United States Patent [19]
Ellis, II et al.

[11] Patent Number: 5,977,690
[45] Date of Patent: Nov. 2, 1999

[54] PIEZOELECTRIC SWITCH APPARATUS FOR A COMMUNICATION DEVICE

[75] Inventors: David L. Ellis, II, Coconut Creek; Andrzej T. Guzik; Rudy Yorio, both of Pompano Beach; Steven D. Pratt; Sivakumar Muthuswamy, both of Plantation; William Boone Mullen, III, Boca Raton, all of Fla.

[73] Assignee: Motorola, Inc., Schaumburg, Ill.

[21] Appl. No.: 08/917,587

[22] Filed: Aug. 25, 1997

[51] Int. Cl.⁶ ................................................. H01L 41/08
[52] U.S. Cl. .......................... 310/330; 310/311; 310/339; 310/319
[58] Field of Search ................... 310/311, 319, 310/317, 330, 353, 339

[56] References Cited

U.S. PATENT DOCUMENTS

| | | | |
|---|---|---|---|
| 3,267,244 | 8/1966 | Schultz | 200/167 |
| 4,160,890 | 7/1979 | Chard et al. | 200/308 |
| 4,639,631 | 1/1987 | Chason et al. | 310/344 |
| 4,742,263 | 5/1988 | Harnden et al. | 310/331 |
| 4,868,448 | 9/1989 | Kornrumpf | 310/331 |
| 5,034,648 | 7/1991 | Gastgeb | 310/339 |
| 5,406,682 | 4/1995 | Zimnicki et al. | 29/25.35 |
| 5,632,669 | 5/1997 | Azarian et al. | 451/54 |
| 5,885,131 | 3/1999 | Azarian et al. | 451/5 |

*Primary Examiner*—Thomas M. Dougherty
*Attorney, Agent, or Firm*—Barbara R. Doutre

[57] ABSTRACT

A control switch for a radio is formed using an electromechanical assembly (400) which includes an array of cantilevered beams (402) laminated with piezoelectric film. A movable surface (404) includes protrusions (406) positioned to deflect the cantilevered beams and generate pulsed signals in a coded manner. Electronic circuitry (410) stores the pulsed signals and associates the signals with a position of the switch.

22 Claims, 3 Drawing Sheets

PIEZOELECTRIC SWITCH APPARATUS FOR A COMMUNICATION DEVICE

CROSS REFERENCE TO RELATED APPLICATIONS

This application is related to U.S. application Docket No. CM01512KL, by Guzik, et al., entitled "Piezoelectric Switch For A Communication Device," filed concurrently herewith, and assigned to Motorola, Inc.

TECHNICAL FIELD

This invention relates in general to communication devices and more particularly to control switches, such as channel selectors and volume control switches, used in communication devices.

BACKGROUND

Mobile and portable radio products have utilized a variety of switch mechanisms to control certain radio functions, such as volume control, on-off, and channel selection. Conventional switch mechanisms include electro-mechanical switches, rotary resistive elements, and/or mechanically encoded rotary switches. Unfortunately, many of the electro-mechanical types of switches have limited reliability due to contact wear and contact contamination as well as problems associated with poor synchronization between electrical contact and tactile feedback. The rotary type switches have proven to be only marginally reliable and often require interconnection to the internal radio circuitry via expensive flex circuits and connectors.

Accordingly, there is a need for an improved control switch apparatus for use in radio products.

DETAILED DESCRIPTION OF THE PREFERRED EMBODIMENT

Figure 2:
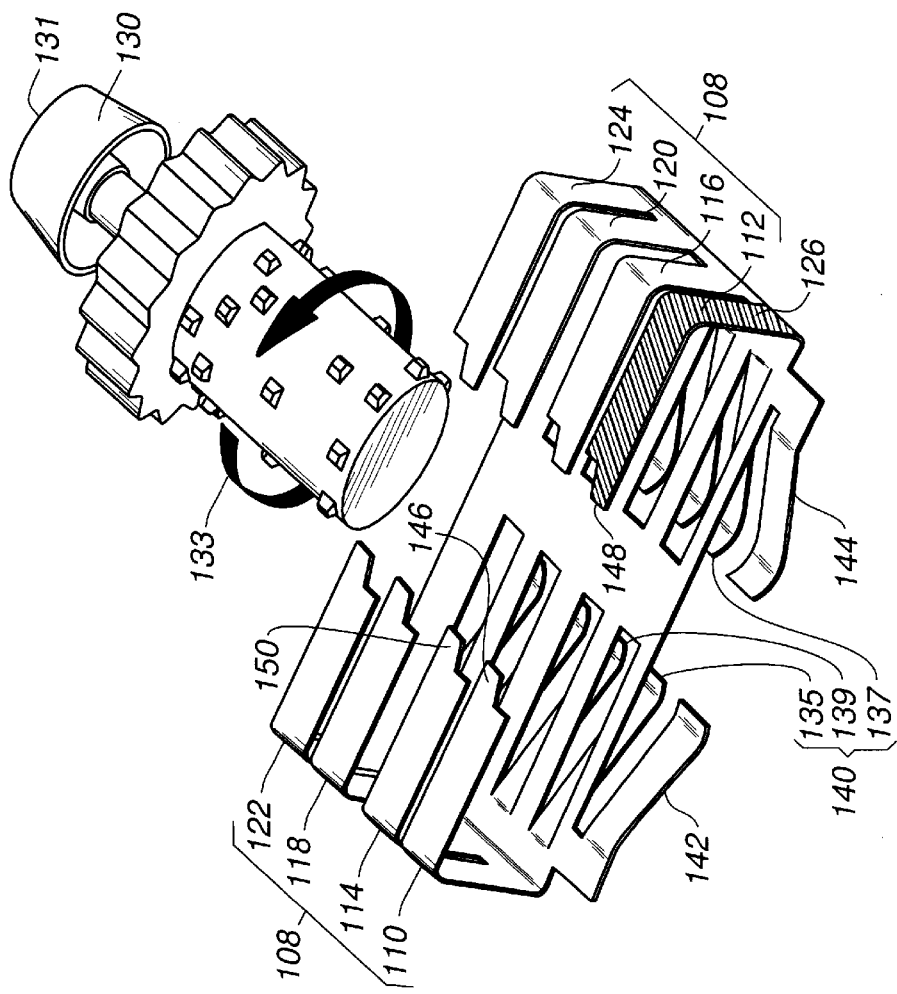
FIG. 2 shows an exploded view of the apparatus of FIG. 1

While the specification concludes with claims defining the features of the invention that are regarded as novel, it is believed that the invention will be better understood from a consideration of the following description in conjunction with the drawing figures, in which like reference numerals are carried forward.

The control switch to be described herein utilizes the electrical output of a piezoelectric film to control radio functions of a two-way radio. While the preferred embodiment will be described in terms of a control switch operating as a channel selector, one skilled in the art realizes that the control switch of the present invention extends to other radio control applications, such as volume control and on/off control. The piezoelectric channel control switch resolves the stated problems of cost and reliability associated with prior art switches.

Figure 1:
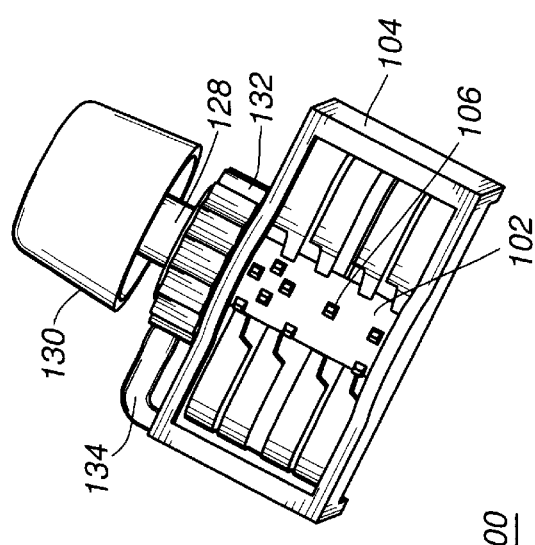
FIG. 1 shows an assembled view of the mechanical portion of a control switch in accordance with the present invention.
Figure 3:
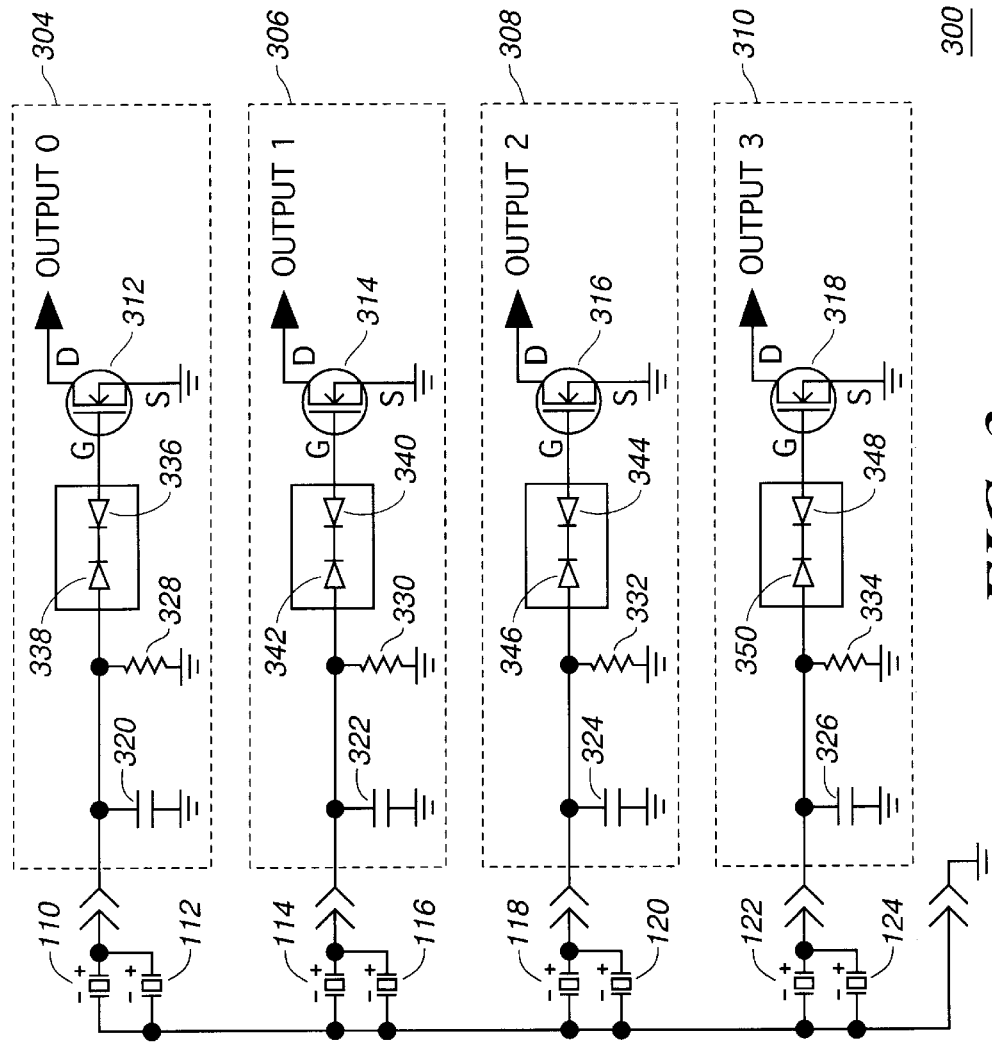
FIG. 3 shows the preferred embodiment of a memory circuit for use with the control switch of FIG. 1.

The control switch of the present invention is comprised of both a mechanical section, the preferred embodiment of which is shown in FIG. 1, and an electrical section, the preferred embodiment of which is shown in FIG. 3. FIG. 2 is a corresponding exploded view of the assembly shown in FIG. 1.

Referring now to FIGS. 1 and 2, the control switch 100 of the preferred embodiment comprises a cylindrical drum 102 mounted in a switch housing 104. In accordance with the invention, the drum 102 includes strategically positioned protrusions 106 to actuate an array 108 of cantilevered beams 110–124 secured within the switch housing 104. For the preferred embodiment of the invention, the protrusions 106 are positioned to provide for a binary encoded contact formation. In accordance with the invention, the array 108 of cantilevered beams 110–124 are laminated with piezoelectric film 126 for generating an electric pulse when mechanically excited. The cylindrical drum 102 is assembled to a shaft 128 retained by a knob 130. The shaft 128 includes evenly spaced gear teeth 132 which provide a predetermined number of detentes for one revolution of the knob 130. Housing 102 preferably includes a cantilevered beam 134 extending therefrom which catches within the gear teeth 132 for each detente. In the preferred embodiment of the invention, gear teeth 132 are spaced to provide for sixteen detentes which correspond to sixteen channel positions.

The array 108 of cantilevered beams 110–124 is preferably formed from a single sheet metal part as shown in FIG. 2. The sheet metal is cut, folded, and formed to provide pairs of opposing cantilevered beams, (110, 112), (114, 116), (118, 120), (122, 124). The piezoelectric film 126 is laminated onto all of the cantilevered beams 110–124 and polarized, preferably using a single polarization process. Each cantilevered beam 110–124 is then separately metallized to provide electrodes for accumulating electrical charges during mechanical excitation of the beams. The metalization extends to finger contacts 140 which provide electrical connection from each cantilevered beam 110–124 to a controller board. Finger contacts 140 include finger contact 135 which is associated with beam 110, finger contact 137 which is associated with beam 112, and finger contact 139 which is associated with beam 114. All other finger contacts will be referred to generally as finger contacts 140. Ground contacts 142, 144 are also included to provide a common ground connection to the array 108. The ground connection preferably extends between the finger contacts 140 and between the opposing pairs of cantilevered beams.

As cylindrical drum 102 rotates from an initial position, which will be referred to as position 0, in a clockwise direction (as viewed from the top 131 of knob 130 and as indicated by phantom line 133) to the next detente, being position 1, a tip 146 of the first cantilever beam 110 is displaced/actuated by one of the protrusions 106. The cantilever beam 110 is then released thereby deflecting the beam back upwards and inducing a positive pulse in the piezoelectric film. The dynamic excitation achieved by the deflection of the cantilevered beam 110 generates a positive electrical charge in the piezoelectric film which is transmitted through the beam's metalization and corresponding finger contact 140 to the electronic circuitry on a controller board. The piezoelectric film's properties are such that the pulses are generated in an anisotropic fashion (along a single axis) and hence do not arc over to other contacts or beams. This property of the piezoelectric film also allows for a single lamination process of the cantilevered beams as opposed to multiple individual laminations.

Referring now to FIG. 3, there is shown an electrical schematic 300 corresponding to the preferred embodiment of an electrical controller section associated with the control switch of the present invention. Each opposing pair of cantilever beams (110,112), (114,116), (118,120), (122,124) is preferably assigned to one of four electrical memory representing a positive pulse turning on the FET and the charge being stored. Memory cell #1 corresponds to FET 312 of FIG. 3. Memory cell #2 corresponds to FET 314 of FIG. 3.

Memory cell #3 corresponds to FET 316 of FIG. 3. Memory cell #4 corresponds to FET 318 of FIG. 3.

| SWITCH POSITION | MEMORY CELL #4 | MEMORY CELL #3 | MEMORY CELL #2 | MEMORY CELL #1 |
|---|---|---|---|---|
| 0 | OFF | OFF | OFF | OFF |
| 1 | OFF | OFF | OFF | ON |
| 2 | OFF | OFF | ON | OFF |
| 3 | OFF | OFF | ON | ON |
| 4 | OFF | ON | OFF | OFF |
| 5 | OFF | ON | OFF | ON |
| 6 | OFF | ON | ON | OFF |
| 7 | OFF | ON | ON | ON |
| 8 | ON | OFF | OFF | OFF |
| 9 | ON | OFF | OFF | ON |
| 10 | ON | OFF | ON | OFF |
| 11 | ON | OFF | ON | ON |
| 12 | ON | ON | OFF | OFF |
| 13 | ON | ON | OFF | ON |
| 14 | ON | ON | ON | OFF |
| 15 | ON | ON | ON | ON | circuits 304, 306, 308, and 310. Each memory circuit 304, 306, 308, and 310 includes a memory cell 312, 314, 316, and 318 respectively, for retaining the voltage level of the pulse generated from the deflection of the cantilevered beams 110–124. The memory cells 312, 314, 316, and 318 preferably comprise internal filed-effect-transistors (FETs) of a memory storage device, such as an EEPROM (electrically erasable programmable read only memory). In accordance with the invention, the pulse generated by the deflection of a beam is essentially captured by the memory cell. Back to back diodes (336, 338), (340, 342), (344, 346), and (348, 350) are coupled in line between each memory cell and its associated pair of piezoelectric coated cantilevered beams to provide conduction and isolation. Resistors 328, 330, 332, and 334 are preferably included to provide a path for excess current. Capacitors 320, 322, 324, and 326 may be included if desired, for protection against inadvertent switch activation caused by RF interference.

Using the first memory circuit 304 as an example, no energy will flow through the FET 312 until a positive voltage breaks down the second diode 338, for example with a pulse of approximately 30 volts, which allows current to conduct through diode 336. When the voltage pulse then drops below 30 volts, diode 336 prevents leakage from the gate of the FET 312. Thus, the electrical charge from the pulse is essentially captured on the gate of FET 312. When a negative pulse is generated, for example of approximately −30 volts, diode 336 breaks down thereby allowing the stored charge on the gate to discharge through resistor 328, essentially erasing the memory state (i.e. making the memory state a 0). The back to back diodes (336, 338), (340, 342), (344, 346), and (346, 348) also prevent small pulses or ringing from getting on the gate of the FETs. Accordingly, the FETs become memory cells for storing either a high or low state. The memory circuits of the present invention are passive circuits and thus draw no current except during actuation.

The following table shows the positions in which positive readable pulses are sent to the memory cells, with "ON"

Rotating knob 130 in a clockwise rotation to the next detente (from switch position 1 to switch position 2), the tip 148 of the second cantilever beam 112 and the tip 150 of the third cantilever beam 114 are simultaneously displaced by corresponding protrusions. In this clockwise rotation, the second cantilever beam 112 generates a negative pulse as the beam snaps back downward after being actuated while the third cantilever beam 114 generates a positive pulse as the beam snaps back upward after being actuated. The negative charge created in the second beam 112 erases memory cell #1, and the positive charge generated in the third beam 114 programs memory cell #2. Further clockwise rotation (down the table) of the knob 130 will increment through the sixteen positions and binary combinations of the four memory cells 312, 314, 316, and 318. Counterclockwise rotation (up the table) will decrement the binary result. Knob 130 can be rotated in either direction starting and ending in any position.

Accordingly, there has been provided an apparatus for a control switch which provides an encoded cantilever beam system laminated with piezoelectric film which generates and stores pulses. The memory cells described by the invention retain their programming even after power is removed, so a radio can be turned off and on again (or even have a battery removed) and the electrical position of the switch will correlate to the knob's legend.

Figure 4:
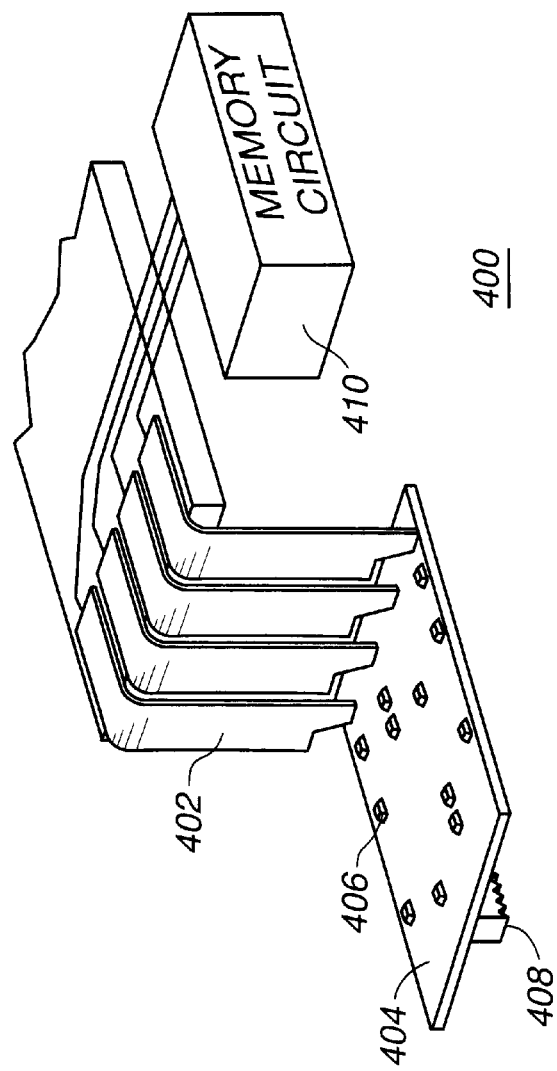
FIG. 4 shows an alternative embodiment of an electro-mechanical assembly for the control switch of the present invention.

While the preferred embodiment has been described in terms of a binary coding scheme, one skilled in the art realizes that a variety of coding schemes, including but not limited to, hexadecimal coding, octal coding, and decimal coding, can be implemented to suit the needs of the application. While the preferred embodiment has also been described in terms of a coded cylindrical drum actuated by a rotatable knob, other mechanical actuators, such as a flat coded slider switch or plate can also be used to actuate and deflect cantilevered beams laminated with piezoelectric film. FIG. 4 shows an example of an alternative embodiment of an electro-mechanical assembly for a control switch 400. In accordance with the alternative embodiment, assembly 400 includes an array of cantilevered beams 402 laminated with piezoelectric film which are actuated by a slidable plate 404. Plate 404 includes an array of protrusions 406 positioned in a predetermined manner in accordance with the invention. As the plate 404 slides, preferably by pushing knob 408, the protrusions 406 deflect the beams 402 to generate pulsed signals which are stored in a memory circuit 410. Thus, the cantilevered beams can be deflected using a variety of movable surfaces with protrusions extending therefrom, such as slider plates, cylindrical drums, or other means suitable to the application.

Figure 5:
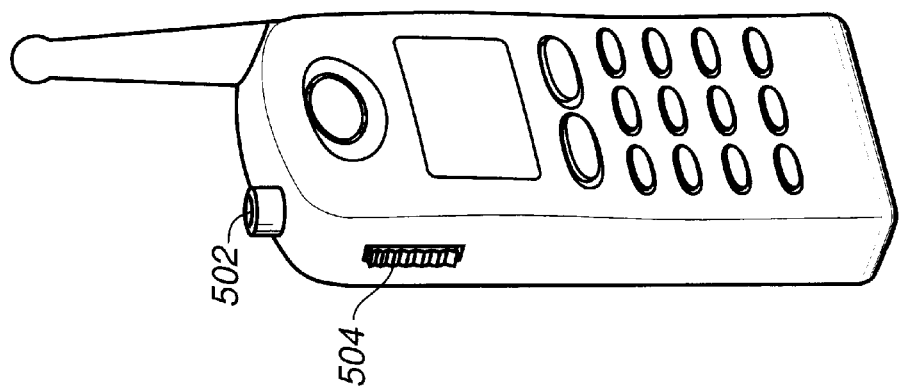
FIG. 5 is a radio incorporating the control switch assembly described by the invention.

The control switch described by the invention draws current only during activation making it ideal for use in portable radio products as well as mobile radio applications. FIG. 5 shows a portable radio 500 including control switches 502, 504 formed in accordance with the present invention. The control switch described by the invention is readily adaptable for use as a channel selector, volume control, on/off switch, and other controlling radio functions.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A control switch for a communication device, comprising:
    an array of cantilevered beams laminated with piezoelectric film;
    an array of protrusions oriented with a predetermined coding scheme;
    a means for actuating the protrusions such that the protrusions deflect the cantilevered beams to generate pulsed signals; and
    electronic circuitry for storing the pulsed signals.

2. The control switch of claim 1, wherein the means for actuating the protrusions comprises a rotatable knob.

3. The control switch of claim 2, wherein the protrusions are coupled to a cylindrical drum, the cylindrical drum turning in response to rotations of the rotatable knob.

4. The control switch of claim 1, wherein the array of protrusions are coupled to a flat slidable plate.

5. The control switch of claim 1, wherein the predetermined coding scheme is a binary coding scheme.

6. The control switch of claim 1, wherein the predetermined coding scheme is a hexadecimal coding scheme.

7. The control switch of claim 1, wherein the cantilevered beams are laminated with the piezoelectric film to provide for the same polarity across all the beams.

8. The control switch of claim 1, wherein the memory circuitry includes a transistor within an electrically erasable programmable read only memory (EEPROM), the transistor having a gate for receiving the pulsed signal.

9. An electro-mechanical assembly for a radio control switch, comprising:
    an array of cantilevered beams laminated with piezoelectric film;
    a movable surface having protrusions extending therefrom, the protrusions being positioned in a predetermined manner to deflect the cantilevered beams and generate pulsed signals; and
    electronic circuitry for storing the pulsed signals, the pulsed signals being associated with the predetermined positioning of the protrusions.

10. The control switch of claim 9, wherein the control switch operates as a channel selector for the radio.

11. The control switch of claim 9, wherein the control switch operates as a volume control for the radio.

12. A control switch for a radio, comprising:
    a housing;
    a knob coupled to the housing, the knob rotatable in both a clockwise and counterclockwise direction;
    a cylindrical drum coupled to the knob within the housing, the drum having protrusions extending therefrom associated with the position of the knob;
    an array of cantilevered beams retained within the housing, the cantilevered beams laminated with a piezoelectric film and sectioned into pairs of opposing cantilevered beams, the cylindrical drum located between the opposing pairs of cantilevered beams such that rotation of the knob causes the protrusions on the drum to deflect the cantilevered beams and generate pulsed signals; and
    electronic circuitry including memory cells for each pair of opposing cantilevered beams, the memory cells sensing the pulsed signals generated by the cantilevered beams, the memory cells storing the pulsed signals associated with the position of the knob.

13. The control switch of claim 12, wherein the cantilevered beams are laminated with the piezoelectric film to provide for the same polarity across all the beams.

14. The control switch of claim 12, wherein the memory cell comprises a transistor within an electrically erasable programmable read only memory (EEPROM), the transistor having a gate for receiving the pulsed signal.

15. The control switch of claim 12, wherein the electronic circuitry includes back to back diodes in line with the gate of the transistor and the cantilevered beam.

16. A control switch for a radio, comprising;
    a knob;
    a cylindrical drum coupled to the knob,
    the cylindrical drum having protrusions extending therefrom;
    an array of opposing pairs of cantilevered beams coated with a piezoelectric film, the cylindrical drum being retained between the opposing pairs of cantilevered beams, a clockwise rotation of the knob turning the drum such that predetermined protrusions displace predetermined cantilevered beams downward and then releases the predetermined cantilevered beams resulting in a positive pulse being generated as the beam snaps back, and a counterclockwise rotation of the knob turning the drum such that predetermined protrusions displace predetermined cantilevered beams upward and then releases the predetermined cantilevered beams resulting in a negative pulse being generated as the beam snaps back; and
    a controller board operatively coupled to the cantilevered beams, the controller board including electronic circuitry for storing the positive pulses and using the negative pulse to erase previously stored positive pulses.

17. The control switch of claim 16, wherein the controller board is operatively coupled to the cantilevered beams through contact fingers extending from the array.

18. A control switch for a radio, comprising:
    a housing;
    a knob coupled to the housing, the knob rotatable in both a clockwise or counterclockwise direction;
    a cylindrical drum coupled to the knob within the housing, the drum having protrusions extending therefrom for encoding the position of the knob;
    an array of cantilevered beams retained within the housing, the cantilevered beams laminated with a piezoelectric film and sectioned into pairs of opposing cantilevered beams, the cylindrical drum located between the opposing pairs of cantilevered beams such that rotation of the knob causes the protrusions on the drum to deflect the cantilevered beams and generate either positive or negative pulses dependent of the direction of the deflection; and a circuit board upon which electronic circuitry is disposed, the electronic circuitry including memory cells associated with each pair of opposing cantilevered beams, the memory cells sensing the positive and negative pulses generated by the cantilevered beams, the memory cells storing the positive pulses, the negative pulses causing the memory cells to erase previously stored positive pulses.

19. The control switch of claim 18, further comprising finger contacts coupled to the cantilevered beams for making contact to the controller board to provide the positive and negative pulses to the memory cells.

20. The control switch of claim 18, wherein a clockwise rotation generates a positive pulse as for each cantilevered beam being deflected upward and a negative pulse for each cantilevered beam being deflected downward.

21. The control switch of claim 18, wherein the memory cell comprises a transistor within an electrically erasable programmable read only memory (EEPROM), the transistor having a gate for receiving the pulsed signal.

22. The control switch of claim 18, wherein the electronic circuitry includes back to back diodes in line between the gate of each transistor and the cantilevered beams.

* * * * *